US006232543B1

(12) United States Patent
Nagata

(10) Patent No.: US 6,232,543 B1
(45) Date of Patent: May 15, 2001

(54) THERMOELECTRIC SYSTEM

(75) Inventor: Yoichi Nagata, Tokorozawa (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 09/343,458

(22) Filed: Jun. 30, 1999

(30) Foreign Application Priority Data

Jul. 2, 1998 (JP) ..................... 10-187149

(51) Int. Cl.[7] ..................... H01L 35/02
(52) U.S. Cl. ..................... 136/242; 136/205; 136/203
(58) Field of Search ..................... 136/203, 205, 136/242

(56) References Cited

U.S. PATENT DOCUMENTS 5,705,770 1/1998 Ogasawara et al. ..................... 136/206
5,835,457 * 11/1998 Nakajima ..................... 369/204

FOREIGN PATENT DOCUMENTS 06022572 1/1994 (JP) .
06153549 5/1994 (JP) .
09308125 11/1997 (JP) .
10142358 11/1997 (JP) .
10014255 1/1998 (JP) .

* cited by examiner

*Primary Examiner*—Kathryn Gorgos
*Assistant Examiner*—Thomas H Parsons
(74) *Attorney, Agent, or Firm*—Armstrong, Westerman, Hattori, McLeland & Naughton, LLP

(57) ABSTRACT

In order to optimally control supply of electric power to a load means and efficiently utilize generated energy of a thermoelectric power generator in consideration of influence of the Peltier effect against generated voltage of the thermoelectric power generator, a thermoelectric system is structured by connecting a load means (20) utilizing the generated power of the thermoelectric power generator (10), and a controller (30) for measuring the generated voltage (V1) of the thermoelectric power generator (10) and controlling power supply and suspension of the power supply to the load means (20) in accordance with the measured result to the thermoelectric power generator (10) provided with a plurality of thermocouples electrically in series, and a compensating means to perform measurement with compensating for the generated voltage when power is supplied from the thermoelectric power generator (10) to the load means (20) continuously for more than a predetermined period of time, is provided to the controller.

16 Claims, 5 Drawing Sheets

THERMOELECTRIC SYSTEM

BACKGROUND OF THE INVENTION

1. Field of the Invention

The present invention relates to a thermoelectric system to supply power (electric energy) generated by a thermoelectric power generator which generates electricity by utilizing an outside temperature difference to a load so as to operate the load. The present invention especially relates to a thermoelectric system which provides a function to adequately control power supply from a thermoelectric power generator to a load, compensating for an influence of the Peltier effect peculiar to the thermoelectric power generator.

2. Description of the Related Art

There exists a thermoelectric system which generates electric power from heat energy caused by an outside temperature difference using a thermocouple and drives electronic equipment such as an electronic timepiece and the like utilizing electric energy obtained from the power generation.

An electronic timepiece driven by generated power from a thermoelectric power generator shown in FIG. 6 can be cited as a conventional example, which applies such a thermoelectric system to a small portable electronic device.

The electronic timepiece has a configuration in which a load means 20 is connected to the thermoelectric power generator 10 and power generated by the thermoelectric power generator 10 can be used with the load means 20.

The load means 20 is configured with a voltage-up converter 23, a timekeeping means 21 and an accumulator 22. The voltage-up converter 23 is connected to the thermoelectric power generator 10 and raises the voltage to twice that of the voltage generated by the thermoelectric power generator 10.

The timekeeping means 21 having a time-clock function and the accumulator 22 which is a second battery are connected in parallel to an output side of the voltage-up converter 23, and the accumulator 22 is charged by a voltage-up output of the voltage-up converter 23 to supply the charged power to the timekeeping means 21.

Furthermore, the electronic timepiece is provided with a generated voltage detector 35 using an amplifier circuit to detect the generated voltage of the thermoelectric power generator 10, and a controller 36 to control operation of the voltage-up converter 23 in accordance with the detected voltage.

The thermoelectric power generator 10 is configured to connect plural thermocouples in series. In the case that the electronic timepiece in this example is a wrist watch, the thermoelectric power generator 10 is disposed so that a warm junction side is contacted with a case back of the wrist watch and a cold junction side is contacted with the case which is insulated against heat from the case back. Heat energy created by a temperature difference between the case back which closely contacts an arm of the person who carries the wrist watch and the case exposed to the outside air, is converted to electric energy.

In an electronic time piece utilizing such a conventional thermoelectric system, generated voltage by the thermoelectric power generator 10 is raised by means of the voltage-up converter 23 after being charged to the accumulator 22 and then used to operate hand-driving of the timekeeping means 21 and the like with the charged electric energy.

At this time, when the generated voltage of the thermoelectric power generator 10 detected by the generated voltage detector 35 exceeds a predetermined value, the controller 36 considers that the generated power of the thermoelectric power generator 10 is applicable and outputs a signal to operate the voltage-up converter 23. Through this process, the voltage-up converter 23 starts voltage-up operation to raise the generated voltage of the thermoelectric power generator 10 to charge the accumulator 22. On the other hand, when the generated voltage of the thermoelectric power generator 10 detected by the generated voltage detector 35 is less than a predetermined value, the controller 36 stops the voltage-up operation of the voltage-up converter 23 to stop power supply to the load means 20 from the thermoelectric power generator 10. At the same time, the controller 36 prevents electric energy charged in the accumulator 22 from discharging to the thermoelectric power generator 10 side.

In the conventional thermoelectric system, when the thermoelectric power generator 10 used for a power generating device is given a higher range of temperatures on the warm junction side and a lower range of temperatures on the cold junction side, the thermoelectric power generator 10 generates electricity through the Seebeck effect and outputs generated voltage (incidentally, the generated voltage caused by Seebeck effect is called thermal electromotive force). Especially, when the thermoelectric power generator 10 has no load, generated voltage proportional to the temperature difference existing between its own warm and cold junctions can be obtained from the thermoelectric power generator 10.

However, when a load is connected to take out power from the thermoelectric power generator 10, current flows from the thermoelectric power generator 10 to the load. The current causes the Peltier effect which is a reaction of the Seebeck effect and a phenomenon which reduces the temperature difference given to the thermoelectric power generator 10. That is, when current flows from the thermoelectric power generator 10 to the load, an exothermic reaction occurs on the cold junction side and an endothermic reaction takes place on the warm junction side. Through this Peltier effect, the temperature difference existing in the thermoelectric power generator is reduced, such that the generated voltage which is a thermal electromotive force is also reduced.

However, in the conventional thermoelectric system, temporary reduction of the thermal electromotive force caused by the Peltier effect is not considered, and the temporary reduction of the thermal electromotive force is merely considered to be the result of a temperature change in the outside circumstances.

Therefore, if the thermoelectric system is configured to switch between operation and suspension of the voltage-up converter in accordance with the magnitude of the generated voltage of the thermal power generating device as above, there exists a disadvantage that the voltage-up converter repeatedly performs the operation and the suspension when the value of the generated voltage is close to the detection threshold value.

That is, when a thermoelectric system is configured to switch between supply and suspension of power to a connected load in accordance with the value of generated power from a thermoelectric power generator, it becomes impossible to precisely measure the thermal electromotive force while the load is in operation. As a result, there may be cases where generated power from the thermoelectric power generator can not be used effectively.

SUMMARY OF THE INVENTION

It is an object of the present invention to solve the above-described disadvantages in a thermoelectric system, to facilitate effective utilization of generated power energy from the thermoelectric power generator while compensating for the influence of the Peltier effect on the generated voltage of the thermoelectric power generator, even when the Peltier effect occurs as a result of power supply from the thermoelectric power generator to a load means.

In order to achieve the above-described object, the thermoelectric system according to the present invention comprises: a thermoelectric power generator provided therein with a plurality of thermocouples electrically in series, a load means for utilizing generated power from the thermoelectric power generator, and a controller for controlling power supply and suspension of the power supply to the load means in accordance with the generated voltage, wherein the controller is provided with a compensating means, when power is continuously supplied to the load means from the thermoelectric power generator for more than a predetermined period of time, which measures compensated the generated voltage.

Furthermore, the thermoelectric system is preferably provided with a controller for controlling operation of the load means.

Additionally, the above-described compensating means is preferably a means for compensating for the amount of reduction of the generated voltage of the thermoelectric power generator caused by the Peltier effect resulting from current which flows when power is continuously supplied from the thermoelectric power generator to the load means for a predetermined period of time.

The above-described controller is preferably provided with a means to intermittently measure the generated voltage of the above-described thermoelectric power generator at a predetermined period of time and to block a power supply route from the thermoelectric power generator to the above-described load means or to put the power supply route in a high impedance state during the measurement.

In such cases, the controller can control so as to supply power to the load means from the thermoelectric power generator if the measured result of the generated voltage during the predetermined period of time exceeds a set value, and to suspend the power supply to the load means if the measured result is below the set value.

Furthermore the thermoelectric system can be configured in a manner that the power for the above-described compensating means regards the power as being continuously supplied from the thermoelectric power generator to the load means for more than a predetermined period of time, under the condition that the measured results described above exceed the set value consecutively by the number of times previously set. The compensating means also measures the generated voltage with compensation from next time of the measurement.

The configured thermoelectric system allows the measured thermal electromotive force to be compensated when influenced by the reduction of generated voltage due to the Peltier effect, which occurs when the continuously supplied electric power to the load means, by thermoelectric power generator is not negligible, so as to control supply and suspension of power to the load, assuming voltage as corresponding to the generated voltage originally expected. Accordingly, a thermoelectric system which can effectively utilize the generated power of the thermoelectric power generator even when the Peltier effect is created, and makes the most of the power which can be generated by the thermoelectric power generator, can be realized without being affected by the Peltier effect.

The above and other objects, features and advantages of the invention will be apparent from the following detailed description which is to be read in conjunction with the accompanying drawings.

DETAILED DESCRIPTION OF THE PREFERRED EMBODIMENTS

Embodiments of the thermoelectric system according to the present invention will be explained in detail with reference to drawings hereinafter.

Figure 1:
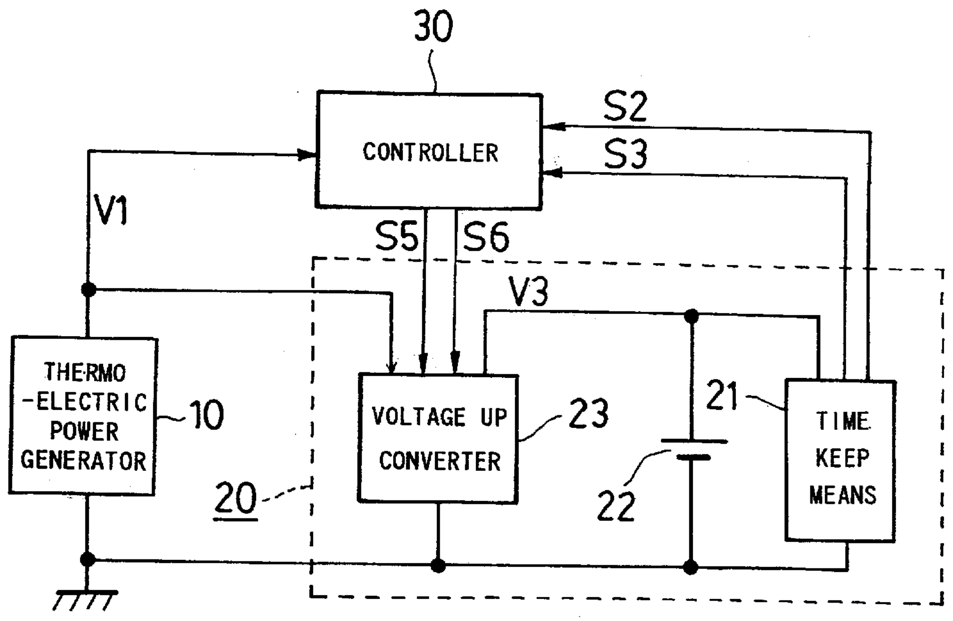
FIG. 1 is a block circuit diagram showing a system configuration of an electronic timepiece which is an embodiment of the thermoelectric system according to the present invention.
Figure 2:
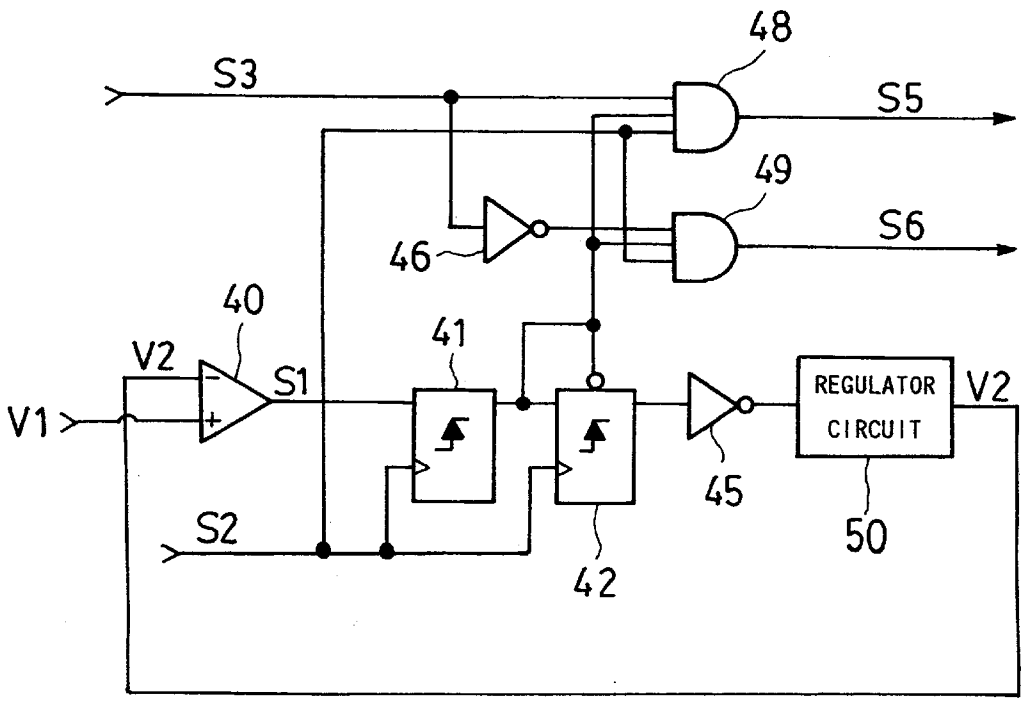
FIG. 2 is a circuit diagram showing a detailed circuit configuration of the controller in FIG. 1.
Figure 3:
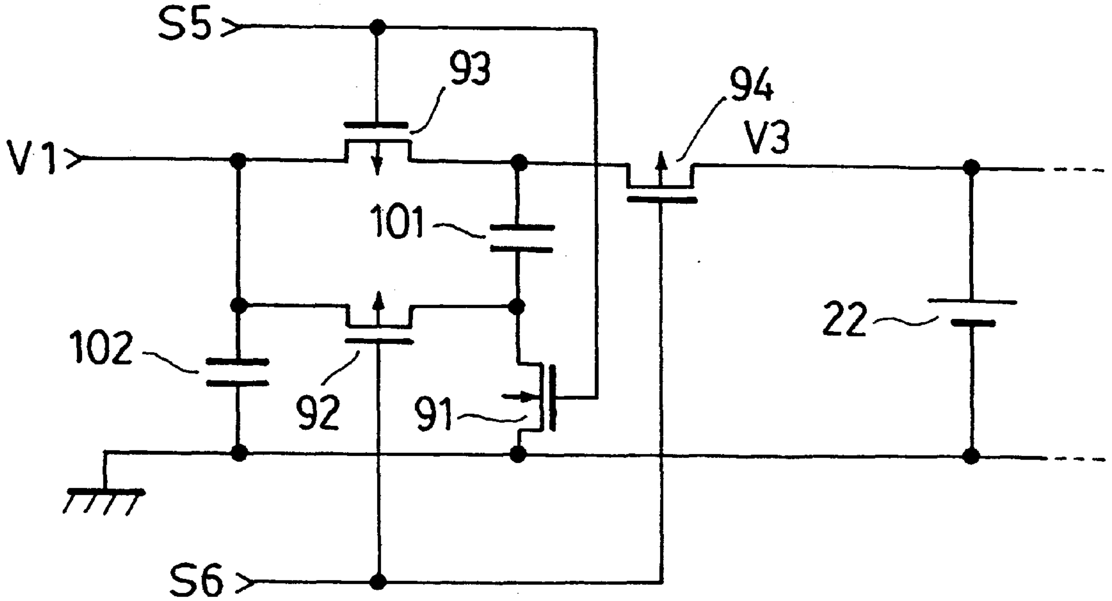
FIG. 3 is a circuit diagram showing a detailed circuit configuration of the voltage-up converter in FIG. 1.
Figure 4:
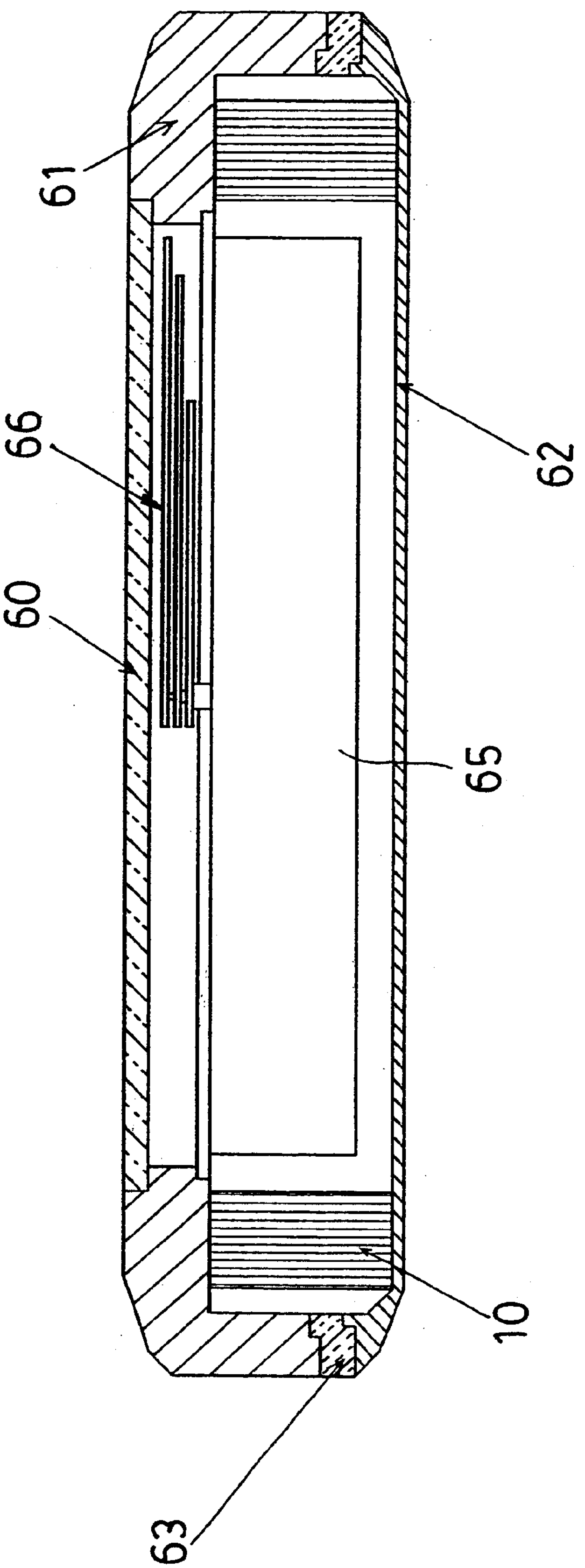
FIG. 4 is a sectional view showing an outline of the inner structure when the electronic timepiece in FIG. 1 is a wrist watch.
Figure 5:
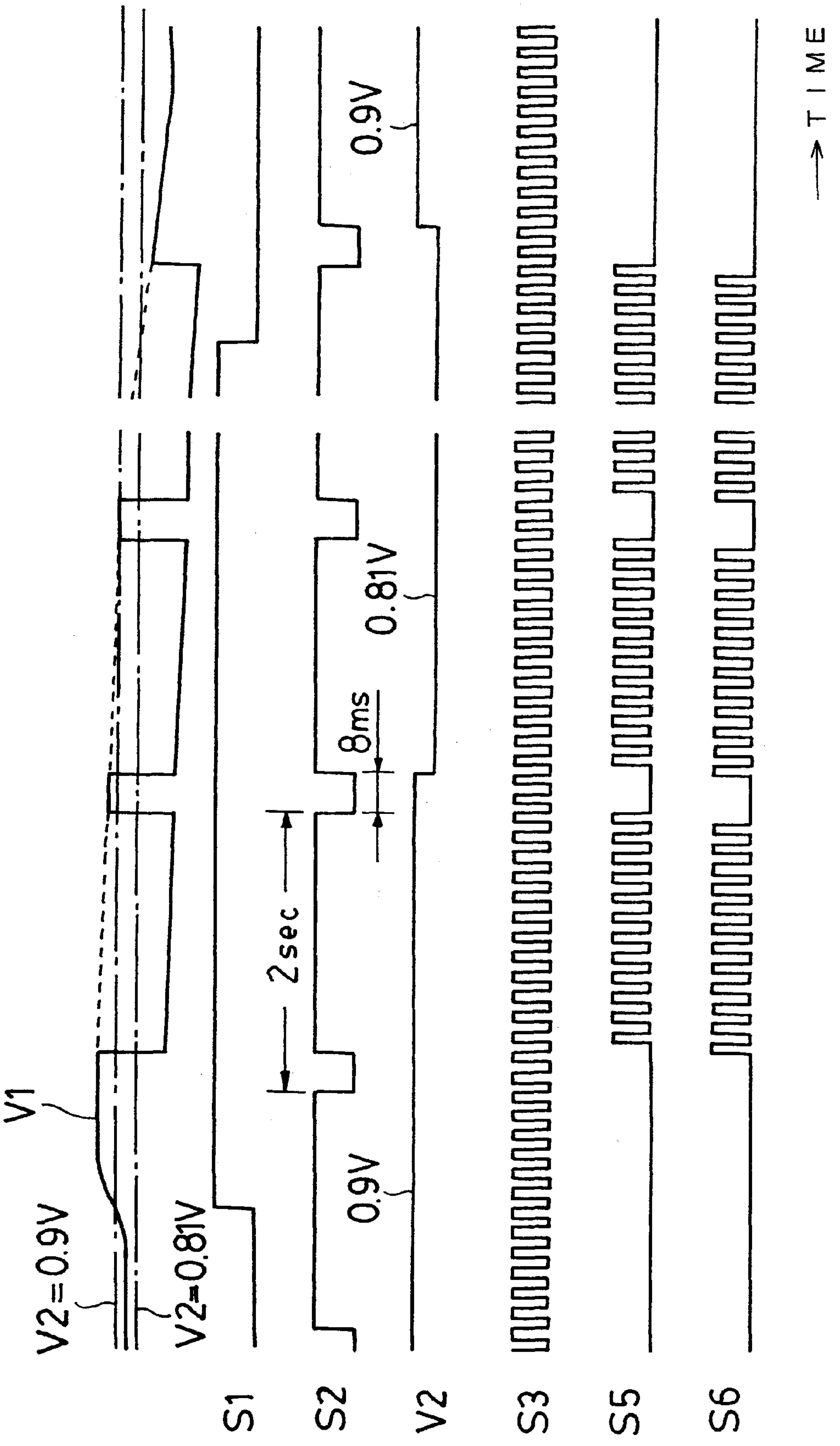
FIG. 5 is a waveform diagram of voltages and signals of each part to explain the operation of the electronic timepiece shown in FIG. 1 to FIG. 3.

FIG. 1 is a block circuit diagram showing a system configuration of an electronic timepiece which is an embodiment of the thermoelectric system according to the present invention. FIG. 2 is a circuit diagram showing a detail circuit configuration of a controller in the electric timepiece, and FIG. 3 is a circuit diagram showing a detail circuit configuration of the voltage-up converter. FIG. 4 is a sectional view showing an outline of the inner structure when the electronic timepiece is a wrist watch, and FIG. 5 is a waveform diagram of voltages and signals in FIG. 1 to FIG. 3 to explain the operation of the electronic timepiece.

Explanation of the System Configuration: FIG. 1

Figure 6:
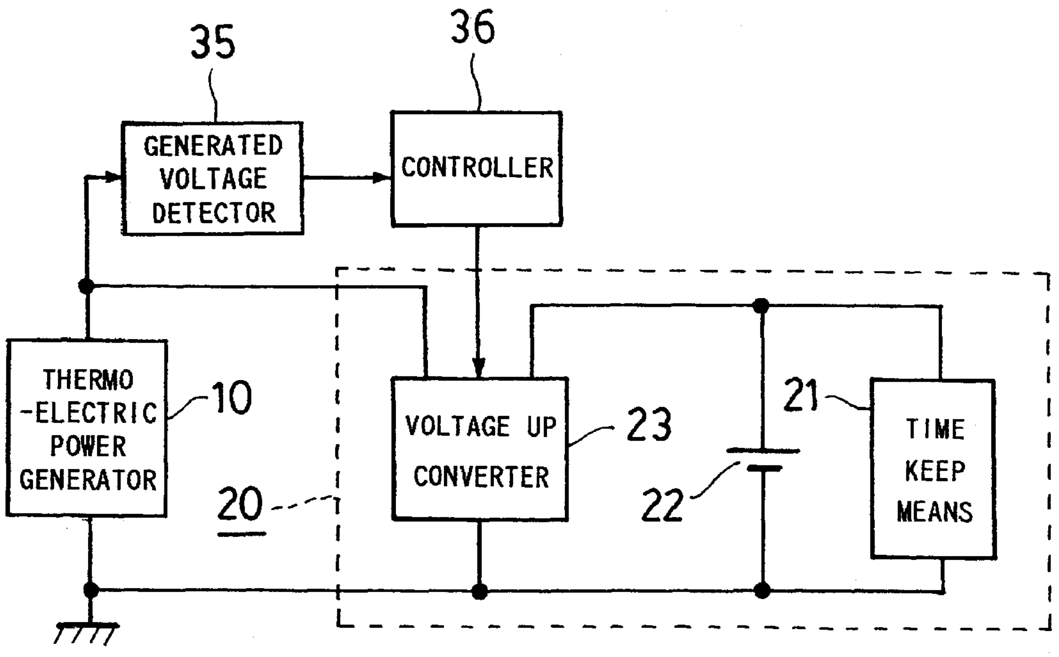
FIG. 6 PRIOR ART
FIG. 6 is a block circuit diagram showing a configuration example of the conventional thermoelectric system.

First, a system configuration of the electronic timepiece which is an embodiment of the thermoelectric system according to the present invention will be explained with reference to FIG. 1. The thermoelectric system of the present embodiment is an electronic timepiece which uses generated power from a thermoelectric power generator as a power source, the same as in the above-described conventional example explained with FIG. 6. Incidentally, the inner configuration of the electronic timepiece will be explained later.

The electronic timepiece shown in FIG. 1 is configured in a manner that a load means 20 is connected to a thermoelectric power generator 10 and power generated by the thermoelectric power generator 10 is supplied to the load means 20 for utilization. The electronic timepiece is further provided with a controller 30 which measures the generated voltage of the thermoelectric power generator 10 and controls power supply and suspension of the power supply to the load means 20 in accordance with the generated voltage.

The thermoelectric power generator 10 in which many thermocouples are electrically connected in series (not shown), is assumed to obtain about 1.5V of thermal electromotive force at a temperature difference of 1° C. The thermoelectric power generator 10 outputs electromotive force obtained by the thermal power generation as a generated voltage V1.

The load means 20 comprises a timekeeping means 21 having a time-clock function, an accumulator 22 and a voltage-up converter 23.

The timekeeping means 21 comprises a time-keep circuit (not shown) which divides a quartz oscillation frequency at least into a frequency of two seconds a cycle in the same way as an ordinary electronic timepiece and deforms the divided signal to a waveform necessary to drive a stepping motor, and a stepping motor which is driven by the waveform of time-keep circuit, and a time displaying system which transmits the rotation of the stepping motor while reducing the rotation with a train wheel, to rotatively drive time displaying hands.

The timekeeping means 21 generates a measuring clock S2 and a voltage-up clock S3 by means of the above-described time-keep circuit, and inputs the measuring clock S2 and the voltage-up clock S3 together into the controller 30.

The measuring clock S2 is a signal having a waveform in which the time to be a low level is 8 milliseconds having a cycle time of 2 seconds, and has trailing edge transitions soon after receiving leading edge transitions of the voltage-up clock S3. The voltage-up clock S3 is a rectangular waveform having a frequency of 4 KHz. Since the formation of waveforms of the measuring clock S2 and the voltage-up clock S3 is possible by a simple waveform synthesizing, a detailed explanation of the synthesizer circuit will be omitted.

In the present embodiment, the time period when measuring clock S2 stays in the low level is simultaneously the time period when the voltage-up converter 23 keeps on suspending the voltage-up operation. The reason why the time period for the voltage-up converter 23 to suspend the voltage-up operation is set, is as follows.

That is, since the voltage which occurs at terminals of the thermoelectric power generator 10 is lower than the voltage capable of actual power generation, due to the influence of current caused by voltage-up operation of the voltage-up converter 23, the suspension time for the voltage-up operation is set so as to suspend the voltage-up converter 23 during and just before measurement of the generated voltage V1 by a comparator 40 which will be explained later, so that the comparator 40 does not measure generated voltage V1 by mistake. The voltage-up suspension time is suitably determined by the time constant due to an inner impedance of the thermoelectric power generator 10 and a capacity load of the voltage-up converter 23.

The accumulator 22 is a second battery using lithium ions, and for an easy explanation, it is assumed that terminal voltage is always taken to be a constant value of 1.8V, without depending on the amount of charge and discharge.

The voltage-up converter 23 is assumed, for simplicity, to be a voltage-up circuit which raises the input voltage twice by switching the connection state of two sets of capacitors. In the voltage-up converter 23, the thermoelectric power generator 10 is connected to an input side, and the accumulator 22 and the timekeeping means 21 are connected in parallel to an output side. The voltage-up converter 23 inputs voltage-up control signals S5 and S6 which are outputted from the controller 30, and raises the generated voltage V1 inputted from the thermoelectric power generator 10 to output to the accumulator 22 and the timekeeping means 21. Incidentally, the circuit and its operation will be later explained in detail.

The negative pole of the thermoelectric power generator 10, the negative pole of the voltage-up converter 23, and the negative pole of the accumulator 22 are all grounded. In this embodiment, the voltage direction usually obtained when this electronic timepiece is worn is taken as the forward direction, the side to get warm at that time is called a warm junction, and the side to get cold is called a cold junction. Further, a terminal where a higher potential is created is taken as "a positive pole (+)", and a terminal where a lower potential is created is taken as "a negative pole (−)".

The controller 30 measures the generated voltage V1 of the thermoelectric power generator 10, controls the operation of the voltage-up converter 23 by means of the voltage-up control signals S5 and S6 in accordance with values of the generated voltage V1 and controls power supply and suspension of the power supply from the thermoelectric power generator 10 to the load means 20. A detail configuration and operation of the controller 30 will be explained later in detail.

It should be noted that all circuit groups such as a time-keep circuit of the above-described timekeeping means 21, portions excepting a capacitor of the voltage-up converter 23, and the controller 30 can be configured on the same integrated circuit similar to a typical electronic timepiece.

Explanation of the Controller: FIG. 2

Next, a configuration and an operation of the controller in the electronic timepiece shown in FIG. 1 will be explained in detail with reference to FIG. 2.

The controller 30 comprises a comparator 40 with an operational amplifier as a voltage measuring means, a first flip-flop circuit 41 and a second flip-flop circuit 42, a first inverter 45 and a second inverter 46, a first AND gate 48 and a second AND gate 49 and a regulator circuit 50.

The comparator 40 outputs a high level signal when input voltage to the noninverting input terminal (+) exceeds input voltage to an inverting input terminal (−), and outputs a low level signal when the input voltage to the noninverting input terminal is equal to or less than the input voltage to the inverting input terminal.

The positive pole of the thermoelectric power generator 10 is connected to the noninverting input terminal of the comparator 40 to input the generated voltage V1, and the output terminal of the regulator circuit 50 is connected to the inverting input terminal, and the outputted voltage is inputted as comparison voltage V2. The output terminal is connected to a data-input terminal of the first flip-flop circuit 41, the generated voltage V1 is compared with the comparison voltage V2, a high level or low level signal S1 in response to the comparison result (measurement result) is outputted as described above, which is inputted to the data-input terminal of the first, flip-flop circuit 41.

The first flip-flop circuit 41 is a data-type flip-flop circuit in which output is reset when the power supply is turned on, and the second flip-flop circuit 42 is a data-type flip-flop circuit with an inverting reset input. The output terminal of the first flip-flop circuit 41 is connected to a data-input terminal of the second flip-flop circuit 42, and the first flip-flop circuit 41 and the second flip-flop circuit 42 are connected in series.

The measuring clock S2 outputted from timekeeping means 21 is inputted to clock input terminals of the first flip-flop circuit 41 and the second flip-flop circuit 42 respectively. Then, respective flip-flop circuits 41 and 42 perform signal holding and signal outputting of the data-input terminal on receiving the leading edge transition of the waveform of the measuring clock S2. Furthermore, an output terminal of the first flip-flop 41 is connected to a reset input terminal of the second flip-flop circuit 42.

The first inverter 45 inputs an output signal of the second flip-flop circuit 42, which is outputted after being inverted.

The second inverter 46 inputs the voltage-up clock S3 outputted from the timekeeping means 21, which is outputted after being inverted.

The measuring clock S2 and the voltage-up clock S3 from the timekeeping means 21, an output signal of the first flip-flop circuit 41 are inputted in the first AND gate 48, and the first AND gate 48 outputs the AND signal of these three signals as a first voltage-up signal S5.

The measuring clock S2 from the timekeeping means 21, and an output signal of the first flip-flop circuit 41, and an output signal of the second inverter 46 (an inversion signal of the voltage-up clock S3) are inputted in the second AND gate 49, and the second AND gate 49 outputs the AND signal of these three signals as a second voltage-up signal S6.

The regulator circuit 50 is a circuit for generating a comparison voltage, and is configured to select either one of two voltage levels to output the comparison voltage V2 from the output terminal. That is, when a high level signal is inputted from the first inverter 45 to the input terminal, a comparison voltage V2 having 0.9V is outputted, and when a low level signal is inputted, a comparison voltage V2 having 0.81V is outputted.

It should be noted that the comparison voltage V2 of the regulator circuit 50 is usually set to 0.9V. This voltage value is set in consideration that when the generated voltage V1 of the thermoelectric power generator 10 becomes larger than 0.9V, a desired charging current can be obtained by outputting twice of the generated voltage V1 to the accumulator 22 which has a terminal voltage of 1.8V. The value of 0.81V is a voltage value of the comparison voltage V2 outputted when the influence of the Peltier effect is compensated, this will be explained later in detail.

Explanation of the Voltage-up Converter: FIG. 3

Next, a configuration and an operation of the voltage-up converter in the electronic timepiece shown in FIG. 1 will be explained with reference to FIG. 3.

The voltage-up converter 23 shown in FIG. 3 comprises a first voltage-up switch 91, a second voltage-up switch 92, a third voltage-up switch 93, a fourth voltage-up switch 94, a first voltage-up capacitor 101 and a second voltage-up capacitor 102.

The first voltage up switch 91 is an n-channel type electric field effect transistor (FET) and the second voltage-up switch 92, the third voltage-up switch 93, and the fourth voltage-up switch 94 are all p-channel type FETs.

The first voltage-up switch 91 connects a negative pole of the first voltage-up capacitor 101 to a drain terminal and grounds a source terminal, and is controlled on or off by the voltage-up control signal S5 from the controller 30 inputted to the gate terminal.

The third voltage-up switch 93 connects a positive pole of the first voltage-up capacitor 101 to the source terminal and connects a positive pole of the thermoelectric power generator 10 to the drain terminal to input the generated voltage V1. And similarly to the first voltage-up switch 91, the third voltage-up switch 93 is controlled on or off by the voltage-up control signal S5 from the controller 30 inputted to the gate terminal.

The second voltage-up switch 92 connects the positive pole of the thermoelectric power generator 10 to the source terminal and connects the negative pole of the first voltage-up capacitor 101 to the drain terminal, and controlled on or off by the voltage-up control signal S6 from the controller 30 inputted to the gate terminal.

The fourth voltage-up switch 94 connects the source terminal to the positive pole of the accumulator 22, and connects the positive pole of the first voltage-up capacitor 101 to the drain terminal. And similarly to the second voltage-up switch 92, the fourth voltage-up switch 94 is controlled on or off by the voltage-up control signal S6 from the controller 30 inputted to the gate terminal.

The first voltage-up capacitor 101 and the second voltage-up capacitor 102 are components attached outside of the integrated circuit described above, in which the capacity is 0.22 $\mu$F for both. The second voltage-up capacitor 102 is connected to the thermoelectric power generator 10 in parallel for stabilizing the terminal voltage of the thermoelectric power generator 10.

A voltage-up output V3 (see FIG. 1) is outputted from the source terminal of the fourth voltage-up switch 94, which is charged to the accumulator 22.

Since the voltage-up converter 23 is configured as above, by switching the on-off states of respective voltage-up switches 91, 92, 93, and 94 through the voltage-up control signals S5 and S6 from the controller 30, the voltage-up converter 23 operates as follows.

First, when the first voltage-up switch 91 and the third voltage-up switch 93 are both in an on-state, the thermoelectric power generator 10 and the first voltage-up capacitor 101 are connected in parallel, the first voltage-up capacitor 101 is charged by the generated voltage of the thermoelectric power generator 10, so that the voltage on the positive pole of the first voltage-up capacitor 101 becomes nearly the same as the generated voltage.

Incidentally, the second voltage-up capacitor 102 is always connected to the thermoelectric power generator 10 in parallel and the voltage on the positive pole is nearly the same as the generated voltage of the thermoelectric power generator 10.

Then, when the first voltage-up switch 91 and the third voltage-up switch 93 are made in an off-state, and at the same time, the second voltage-up switch 92 and the fourth voltage-up switch 94 are in an on-state, the parallel circuit of the thermoelectric power generator 10 and the second voltage-up capacitor 102, is connected to the first voltage-up capacitor 101 in series. Accordingly, in a non-load state where load is not connected, voltage obtained by adding terminal voltage of the first voltage-up capacitor 101 to the generated voltage of the thermoelectric power generator 10, that is, the voltage twice of the generated voltage, can be obtained on the drain terminal of the fourth voltage-up switch 94 as a voltage-up output.

Explanation of a Configuration of the Electronic Timepiece: FIG. 4

An example of the inner configuration of the above-described timepiece is shown in FIG. 4 when it is a wrist watch. In this electronic timepiece, a metal case 61 fitting a glass 60 therein on the upper surface portion, and a metal case back 62 are integrally engaged through a heat insulator 63 to form a closed space in the inside thereof. A thermoelectric power generator 10 which is composed of many thermocouples formed in a ring-shape is disposed around the closed space, and a movement 65 is provided, which rotationally drives a time-display hand group 66 consisting of an hour hand, minute hand and second hand in the inside.

In the thermoelectric power generator 10, the warm junction side is adhered to the inner surface of the back case 62 which is heated by a bodily temperature when the wrist watch is worn on an arm, and the cold junction side is adhered to the inner surface of the case 61 which is cooled by air.

The load means 20 and the controller 30 shown in FIG. 1 are housed in the movement 65, and each hand of the hand group 66 is rotated through the train wheels respectively by a stepping motor rotationally driven by a drive waveform signal from the time-keep circuit of the timekeeping means 21 in the load means 20.

The time-keep circuit, circuits excepting the first and second voltage-up capacitors 101, and 102, of the voltage-up converter 23, and the control circuit 30 are formed into the same integrated circuit (IC) as described above and are provided within the movement 65.

Explanation of the Operation of the Thermoelectric System: FIG. 1 to FIG. 3 and FIG. 5.

Next, the operation of an embodiment of the above-described electronic timepiece, that is a thermoelectric system according to the present invention, will be explained with reference to FIG. 1 to FIG. 3 and FIG. 5.

In the following explanation, assuming that electric energy accumulated in the accumulator 22 is sufficient to drive the timekeeping means 21, the terminal voltage of the accumulator 22 always maintains 1.8V regardless of whether it is charging or discharging. When the accumulator 22 is in this state, the timekeeping means 21 can be operated and performs usual time-keep operation and hand-drive operation. And the controller 30 is also in an on-state.

At this time, the first flip-flop circuit 41 shown in FIG. 2 in the control circuit 30, is in a state such that the time keeping data is reset by turning the power on, that is, outputs a low level signal. Then, the first AND gate 48 and the second AND gate 49 always output low level signals as voltage-up signals S5 and S6 to input a low level signal outputted from the first flip-flop circuit 41.

Consequently, the voltage-up converter 23 shown in FIG. 3 is in a state that all voltage-up switches 91 to 94 are off to stop the operation.

In the second flip-flop circuit 42 of the controller 30, the time keeping data and the output signal are reset to input a low level output signal of the first flip-flop circuit 41. Accordingly, since the output signal becomes a low level and the output signal of the first inverter 45 inputted into the regulator circuit 50 becomes a high level, the regulator circuit 50 outputs voltage of 0.9V as the comparison voltage V2.

Now, it is assumed that an electronic timepiece of this thermoelectric system is under a circumstance that not much of a temperature difference occurs between both terminals of the thermoelectric power generator 10, and the generated voltage V1 became about 0.85V, below 0.9V.

Then, the comparator 40, shown in FIG. 2 of the controller 30, compares the generated voltage V1 of about 0.85V with the comparison voltage V2 of 0.9V, and judges it to be $V1<V2$ and makes the output signal S1 (measured output) in a low level (refer to FIG. 5).

On the other hand, in the measuring clock S2 inputted into the first flip-flop circuit 41, as shown in FIG. 5, the waveform makes the trailing edge transitions from a high level to a low level at a 2 second period and makes the leading edge transition after 8 milliseconds. That is, it alternatively repeats to be in a high level state during a period of 2 seconds minus 8 milliseconds, and in a low level state during a period of 8 milliseconds.

The first flip-flop circuit 41 captures the measured output S1 when the measuring clock S2 is at the leading edge transitions. And when the measured output S1 is in a low level, the output is maintained in the low level by capturing the measured output S1 in the low level. Accordingly, the low level signal continues to input into both the first AND gate 48 and the second AND gate 49 similarly to the time of initialization. Therefore, the voltage-up control signals S5 and S6 stay in the low level, and as a result, the voltage-up converter 23 stays in a suspension state of voltage-up.

Soon, a temperature difference of about 0.67° C. is created at both ends of the thermoelectric power generator 10 and the generated voltage V1 is assumed to reach 1.0V, in other words, greater than 0.9V. Then, the comparator 40, shown in FIG. 2, of the controller 30 compares the generated voltage V1 of 1.0V with the comparison voltage V2 of 0.9V and judges it to be $V1>V2$, so that the output signal (measured output) S1 is made to be in a high level (refer to FIG. 5).

When the waveform of the measuring clock S2 takes the trailing edge transitions from the high level to the low level at a period of two seconds and takes the leading edge transitions after 8 milliseconds by taking the measured output S1 to be in the high level, the first flip-flop circuit 41 captures the high level measured output S1 to make the output in the high level. Through this, the second flip-flop circuit 42 is canceled and the reset state is in a waiting state for capturing data.

When the output of the first flip-flop circuit 41 is in the high level, the first AND gate 48 outputs a waveform corresponding to the AND signal of the voltage-up clock S3 and the measuring clock S2 as the voltage-up control signal S5. Similarly, the second AND gate 49 outputs a waveform corresponding to the AND signal of an inversion signal of the voltage-up clock S3 and the measuring clock S2 as a voltage-up control signal S6.

At this time, both the voltage-up control signals S5 and S6 alternatively repeat the high level and the low level at the same periodicity as that of the voltage-up clock S3 having a frequency of 4 KHz as shown in FIG. 5. At the same time, when the voltage-up control signal S5 is in the high level, the voltage-up control signal S6 is in the low level, and when the voltage-up control signal S5 is in the low level, the voltage-up control signal S6 is in the high level. That is, the voltage-up control signals S5 and S6 become signals which mutually inverse their phases.

Both the voltage-up control signals S5 and S6 are signals having waveforms in which the voltage-up converter 23 is designed to perform voltage-up operation. As explained as the configuration and operation of the above-described voltage-up converter 23, when the voltage-up control signals S5 and S6 having this waveform are inputted into the voltage-up converter 23, the voltage-up converter 23 performs a voltage-up operation which allows to output voltage of twice the value of the generated voltage V1 while the measuring clock S2 is in the high level.

That is, if the generated voltage larger than 0.9V is generated after the thermoelectric power generator 10 starts power generation, the voltage-up converter 23 starts voltage-up operation to charge the accumulator 22. Through this step, power supply from the thermoelectric power generator 10 to the load means 20 is started to perform.

If the circumstances are maintained in which the temperature difference of 0.67° C. is possible to be created, the waveform of the measuring clock S2 takes the trailing edge transition again during that time. Then, since the voltage-up control signals S5 and S6 which are outputs of the first AND gate 48 and the second AND gate 49 become to be in the low level during 8 milliseconds in which the measuring clock S2 is in the low level, the voltage-up operation of the voltage-up converter 23 temporarily suspends.

When the measuring clock S2 takes the leading edge transition after 8 milliseconds, the first flip-flop circuit 41 captures the measuring clock S1 which is still in the high level and outputs the high level signal. The second flip-flop circuit 42 captures the high level output signal retained by the first flip-flop circuit 41 until just before the measuring clock S2 makes the leading edge transition. At this time, the second flip-flop circuit 42 is reset to output the output signal changing from low level to high level.

When the output signal of the second flip-flop circuit 42 becomes in the high level, the first inverter 45 inverts it and inputs the low level signal into a regulator circuit 50. The regulator circuit 50 outputs the comparator voltage V2 changing from 0.9V to 0.81V.

At this time, since the output of the first flip-flop circuit 41 is in the high level, when the measuring clock S2 makes the leading edge transition, the voltage-up control signals S5 and S6 are again outputted, as shown in FIG. 5, and the voltage-up converter 23 continues the voltage-up operation.

Furthermore, if the circumstances are maintained in which the temperature difference of 0.67° C. is possible to be created similarly in the thermoelectric power generator 10, the waveform of the measuring clock S2 again makes the leading edge transition, similarly to the above, and makes the trailing edge transition two seconds later. The voltage-up converter 23 then temporarily suspends.

At this time, the thermoelectric power generator 10 is to supply power to the load means 20 continuously during the aforementioned period of about 4 seconds (around two cycles of the measuring clock S2) to keep on feeding charging current to the accumulator 22 through the voltage-up converter 23 or feeding current to the timekeeping means 21. Accordingly, the thermoelectric power generator 10 receives influence of the Peltier effect caused by the current, and the temperature difference created between both ends is substantially decreased and the generated voltage V1 gradually declines as shown by a broken line in FIG. 5.

Therefore, while the measuring clock S2 gets the low level, the thermoelectric power generator 10 becomes a no-load state separated from the voltage-up converter 23, and although current does not pass to the load means 20, the temperature difference can not be retrieved so soon. As a result, voltage of, for instance, 0.9V that is lower than a thermal electromotive force of 1.0V which should be created by the temperature difference of 0.67° C. appears as a generated voltage V1.

When the generated voltage of 0.9V appears just after power generation starts, a state to suspend the voltage-up operation of the voltage-up converter 23 is to be continued. But at this time, the comparison voltage V2 outputted by the regulator circuit 50 has been changed to 0.81V in the controller 30 during the previous measuring of generated voltage, estimating the amount of voltage lowered by the influence of the Peltier effect as described above.

That is, when the thermoelectric power generator 10 supplies power for more than a predetermined period of time continuously, in this instance, when the measured result of the generated voltage by means of the comparator 40 exceeds the comparison voltage consecutively two times, the controller 30 regards the influence of the Peltier effect as being not able to ignore, then reduces the value of the comparison voltage V2 outputted by the regulator circuit 50 and measures the generated voltage V1 by the comparator 40 compensating for the lowered value of the generated voltage V1 due to the influence of the Peltier effect. The function described above corresponds to the "compensating means" in the present invention.

Therefore, even when the generated voltage V1 of the thermoelectric power generator 10 in this time of measuring is 0.9V, the output signal (measured output) S1 is outputted continuously in the high level, because the comparator 40 in FIG. 2 measures the power generating voltage V1 of 0.9V comparing with the comparison voltage of 0.81V. Accordingly, when the measuring clock S2 takes the leading edge transition, the output signal of the first flip-flop circuit 41 becomes again in the high level.

Accordingly, while the measuring clock S2 is in the high level, the voltage-up control signals S5 and S6 are outputted continuously as waveform signals which allow the voltage-up converter 23 to perform voltage-up operation as shown in FIG. 5.

Thus, in this embodiment, when the voltage-up converter 23 keeps on performing the voltage-up operation continuously for more than a predetermined period of time (about 4 seconds), the power generating voltage V1 lowers to 0.9V by the influence of the Peltier effect. Yet, regarding that the actual thermoelectric power generator 10 has capacity to generate voltage corresponding to 1.0V, the controller 30 controls so as to continue power supply from the thermoelectric power generator 10 to the load means 20 without suspending the voltage-up operation of the voltage-up converter 23.

Next, suppose that while the voltage-up converter 23 thus continues the voltage-up operation, circumstances are changed to a state in which a temperature difference of only 0.6° C. is created on both ends of the thermoelectric power generator 10. This temperature difference corresponds a temperature difference in which the generated voltage V1 is 0.9V, if the thermoelectric power generator 10 has no load.

At this time, similar as above, when a waveform of the measuring clock S2 again takes the trailing edge transition, the voltage-up converter 23 temporarily suspends the voltage-up operation. But since the influence of the Peltier effect remains during the period of time that the waveform of the measuring clock S2 keeps in the low level, the actual generated voltage V1 inputted to the comparator 40 of the controller 30 is about 0.81V which is lower than 0.9V described above.

Consequently, since the comparator 40 compares the generated voltage V1 of 0.81V with the comparison voltage V2 of 0.81V, and outputs the output signal (measured output) S1 in the low level, judging it to be $V1 \leqq V2$, the output of the first flip-flop circuit 41 shifts from the high level to the low level at the leading edge transition of the measuring clock S2.

When the output of the first flip-flop circuit 41 is in the low level, the controller 30 becomes a state initialized similar to the beginning of the power supply. That is, the voltage-up control signals S5 and S6 are fixed in, the low level as shown in the right end portion in FIG. 5. And the keeping data in the second flip-flop circuit 42 is also reset, and the regulator circuit 50 outputs voltage of 0.9V as the comparison voltage V2.

At this time, by fixing the voltage-up control signals S5 and S6 outputted from the controller 30 in the same way as the beginning of the power supply, the voltage-up converter 23, remains in a state of suspension of the voltage-up operation.

Accordingly, when generated power of the thermoelectric power generator 10 cannot substantially be supplied to the load means 20 depending on whether the electronic timepiece is put, the controller 30 suspends the operation of the voltage-up converter 23 to stop the power supply from the thermoelectric power generator 10, so that electric energy charged in the accumulator 22 does not flow backward to the thermoelectric power generator 10. At this time, electric energy charged in the accumulator 22 is supplied to the timekeeping means to allow the operation to continue.

It is clear by the above explanation, when the generated voltage V1 of the thermoelectric power generator 10 raises voltage and reaches a voltage value of a predetermined level capable to utilize thereof, the electronic timepiece which is a thermoelectric system of the present embodiment feeds the generated voltage of the thermoelectric power generator 10 to the load means 20, and raises voltage by the voltage-up converter 23 to charge the accumulator 22. After that, when the power supply is continued for more than a predetermined period of time (in the above example, it is 4 seconds which is 2 cycles of the measuring clock S2), the generated voltage V1 of the thermoelectric power generator 10 is measured with compensation, and the voltage-up operation of the voltage-up converter 23 is continued even when the generated voltage V1 is lower than the above-described predetermined level. And when the generated voltage V1 of the thermoelectric power generator 10 is lower than another level which is set to be lower than the above-described predetermined level, it operates in such a manner that the voltage-up operation of the voltage-up converter 23 is suspended so as to suspend the power supply to the load means 20.

Though no reference is made in the previous explanation of the operation, when the generated power from the thermoelectric power generator 10 is not taken out continuously, that is, when the generated voltage V1 of the thermoelectric power generator 10 is lowered due to a change of circumstances, and the comparator 40 of the controller 30 makes the measuring output S1 to be in the low level, just after the measurement that the generated voltage V1 of the thermoelectric power generator 10 is in the level capable of voltage-up charging, output of the first flip-flop circuit 41 takes the low level in the following measurement, thereby the controller 30 becomes an initial state similar to power on, and a compensating operation is not performed.

It should be noted that when the generated voltage V1 of the thermoelectric power generator 10 is compensated, continuous power supply for more than 4 seconds from the thermoelectric power generator 10 to the load means 20 is regarded as the condition for it. It is preferable to determine the time for the condition of performing the compensation by suitably changing it in accordance with heat-conductive structure of the warm or cold junction portion where the thermoelectric power generator 10 in the electric timepiece is provided, heat capacity or a heat-conductive structure in relation to the outside.

Furthermore, in this embodiment, compensation at the times of measuring the generated voltage is carried out by just changing the comparison voltage (threshold value) in the comparator 40, the Peltier effect often changes the magnitude of the effect according to the amount of current passing from the thermoelectric power generator 10. In such cases, more flexible thermoelectric system to perform compensation considering the magnitude of the Peltier effect can be realized by providing another means to measure the amount of electric current passing from the thermoelectric power generator 10, and by setting in advance voltage for which the controller 30 compensates in response to the measured amount of current.

Additionally, in this embodiment, the load means 20 is cited to explain a load means, in which a charging circuit of a second battery (accumulator 22) using the voltage-up converter 23 is a main load, but the load means is not limited to this but any electronic device which is a load using the generated power of the thermoelectric power generator 10 to perform the operation will be applicable.

It is conceivable, for instance, to be a load means which uses a voltage-up converter capable of changing the magnification of the voltage-up operation, though not used in the above-mentioned embodiment. In such a case, precise measurement of the generated voltage V1 is required to select a suitable magnification of the voltage-up operation according to the change of the generated voltage V1, but the present invention is applicable to such a case without any problem.

In addition, various examples of application can be conceivable such as a case when a voltage value of the generated voltage V1 is displayed with liquid crystals. In such cases, it can also be performed by adding a compensation according to the present invention to an output signal performed by an analog-digital conversion using an analog-digital converter (A/D conversion) circuit to obtain a binary generated voltage value of the thermoelectric power generator. However, in this case, the analog-digital converter circuit corresponds to a means for measuring power generations, the controller is required only to process the analog-digital conversion output by adding compensation, and the operation of the analog-digital converter circuit need not change.

As explained above, according to the thermoelectric system of the present invention, supply of power and suspension of the power supply to the load means can be optimally controlled in response to the generated voltage of the thermoelectric power generator by measuring with compensation for the lowering of generated voltage due to the Peltier effect created by such a manner that the thermoelectric power generator continues to pass a load current, and the load means can utilize generated power of the thermoelectric power generator most effectively.

What is claimed is:

1. A thermoelectric system, comprising:

a thermoelectric power generator provided with a plurality of thermocouples electrically arranged in series;

a load means utilizing generated electric power of said thermoelectric power generator; and a controller for measuring generated voltage of said thermoelectric power generator and controlling power supply and suspension of the power supply to said load means in accordance with the generated voltage, wherein said controller is provided with a compensating means which compensates the generated voltage when power is continuously supplied to said load means from said thermoelectric power generator for more than a predetermined period of time, and which measures the compensated generated voltage.

2. The thermoelectric system according to claim 1, wherein said controller further comprises another controller to control operations of said load means.

3. The thermoelectric system according to claim 2, wherein said compensation means is a means which compensates the generated voltage by the amount of reduction of the generated voltage of said thermoelectric power generator caused by the Peltier effect resulting from current which flows when power is continuously supplied from said thermoelectric power generator to said load means for more than a predetermined period of time, and measures the compensated generated voltage.

4. The thermoelectric system according to claim 3, wherein said controller is provided with a means to intermittently measure the generated voltage of said thermoelectric power generator at a predetermined period of time and to block the power supply route from said thermoelectric power generator to said load means or to put the power supply route in a high impedance state during the measurement.

5. The thermoelectric system according to claim 4, wherein said controller is to control so as to supply power from said thermoelectric power generator to said load means when the result of the generated voltage measured at the predetermined period exceeds a set value, and to suspend the power supply to said load means when the measured result is below the set value.

6. The thermoelectric system according to claim 4, wherein said compensation means compensates the generated voltage and measures the compensated generated voltage at the next measurement time when the measured result exceeds the set value consecutively by the number of times previously set.

7. The thermoelectric system according to claim 2, wherein said controller is provided with the means to intermittently measure the generated voltage of said thermoelectric power generator at a predetermined period of time and to block the power supply route from said thermoelectric power generator to said load means or to put the power supply route in a high impedance state during the measurement.

8. The thermoelectric system according to claim 7, wherein said controller is to control so as to supply power from said thermoelectric power generator to said load means when the result of the generated voltage measured at the predetermined period exceeds a set value, and to suspend the power supply to said load means when the measured result is below the set value.

9. The thermoelectric system according to claim 7, wherein said compensation means compensates the generated voltage and measures the compensated generated voltage at the next measurement time when the measured result exceeds the set value consecutively by the number of times previously set.

10. The thermoelectric system according to claim 1, wherein said compensating means is a means which compensates the generated voltage by the amount of reduction of the generated voltage of said thermoelectric power caused by the Peltier effect resulting from current flows when power is continuously supplied from said thermoelectric power generator to said load means for more than a predetermined period of time, and measures the compensated generated voltage.

11. The thermoelectric system according to claim 10, wherein said controller is provided with means to intermittently measure the generated voltage of said thermoelectric power generator at a predetermined period of time and to block the power supply route from said thermoelectric power generator to said load means or to put the power supply route in a high impedance state during the measurement.

12. The thermoelectric system according to claim 11, wherein said controller is to control so as to supply power from said thermoelectric power generator to said load means when the result of the generated voltage measured at the predetermined period exceeds a set value, and to suspend the power supply to said load means when the measured result is below the set value.

13. The thermoelectric system according to claim 11, wherein said compensation means compensates the generated voltage and measures the compensated generated voltage at the next measurement time when the measured result exceeds the set value consecutively by the number of times previously set.

14. The thermoelectric system according to claim 1, wherein said controller is provided with a means to intermittently measure the generated voltage of said thermoelectric power generator at a predetermined period of time and to block the power supply route from said thermoelectric power generator to said load means or to put the power supply route in high impedance state during the measurement.

15. The thermoelectric system according to claim 14, wherein said controller is to control so as to supply power from said thermoelectric power generator to said load means when the result of the generated voltage measured at the predetermined period exceeds a set value, and to suspend the power supply to said load means when the measured result is below the set value.

16. The thermoelectric system according to claim 14, wherein said compensating means compensates the generated voltage and measures the compensated generated voltage at the next measurement time when the measured result exceeds the set value consecutively by the number of times previously set.

* * * * *